United States Patent [19]

Hardy et al.

[11] Patent Number: 4,701,708

[45] Date of Patent: Oct. 20, 1987

[54] POLARIZATION TRANSFER BY SELECTIVE HOMONUCLEAR TECHNIQUE FOR SUPPRESSION OF UNCOUPLED SPINS IN NMR SPECTROSCOPY

[75] Inventors: Christopher J. Hardy, Schenectady; Charles L. Dumoulin, Ballston Lake, both of N.Y.

[73] Assignee: General Electric Company, Schenectady, N.Y.

[21] Appl. No.: 891,823

[22] Filed: Aug. 1, 1986

[51] Int. Cl.$^4$ ............................................. G01R 33/20
[52] U.S. Cl. .................................... 324/311; 324/308; 324/312
[58] Field of Search ............... 324/300, 307, 308, 312, 324/309, 310, 311, 313, 314

[56] References Cited

U.S. PATENT DOCUMENTS

| | | | |
|---|---|---|---|
| 4,068,161 | 1/1978 | Ernst | 324/312 |
| 4,345,207 | 8/1982 | Bertrand | 324/308 |
| 4,521,732 | 6/1985 | Pegg et al. | 324/312 |
| 4,581,582 | 4/1986 | Redington | 324/308 |

Primary Examiner—Michael J. Tokar
Attorney, Agent, or Firm—Geoffrey H. Krauss; James C. Davis, Jr.; Marvin Snyder

[57] ABSTRACT

A method of suppressing at least one undesired resonance response signal while facilitating reception of at least one other desired NMR response signal from a coupled spin resonance in NMR spectroscopy, utilizes a pair of alternating sequences of RF signal pulses, with each sequence having an initial $\pi/2$ RF pulse, followed by a $\pi$ RF signal pulse having a temporal midpoint at a time interval T after the temporal midpoint of the initial pulse (where $T=n/4J$, with n being an odd integer and J being the spin coupling constant of the hydrogen nuclei) and a final $\pi$ RF signal pulse with a temporal midpoint at twice the time interval T after the temporal midpoint of the first $\pi$ RF signal pulse in that sequence. Only one of the pair of sequences is provided with a polarization transfer narrowband $\pi$ RF signal pulse symmetrically disposed about a temporal midpoint located at substantially a time interval T after the first $\pi$ RF signal pulse of that sequence and substantially at a frequency removed from the resonance frequency of at least one undesired uncoupled spin resonance. Response signals are acquired within a gating period including a temporal point thereof occurring at a time interval T after the temporal midpoint of the final $\pi$ RF signal pulse. The pair of recovered sets of data are substracted from one another to obtain a final data set in which noncoupled spin resonance data is substantially cancelled but desired coupled spin resonance data is preserved.

18 Claims, 14 Drawing Figures

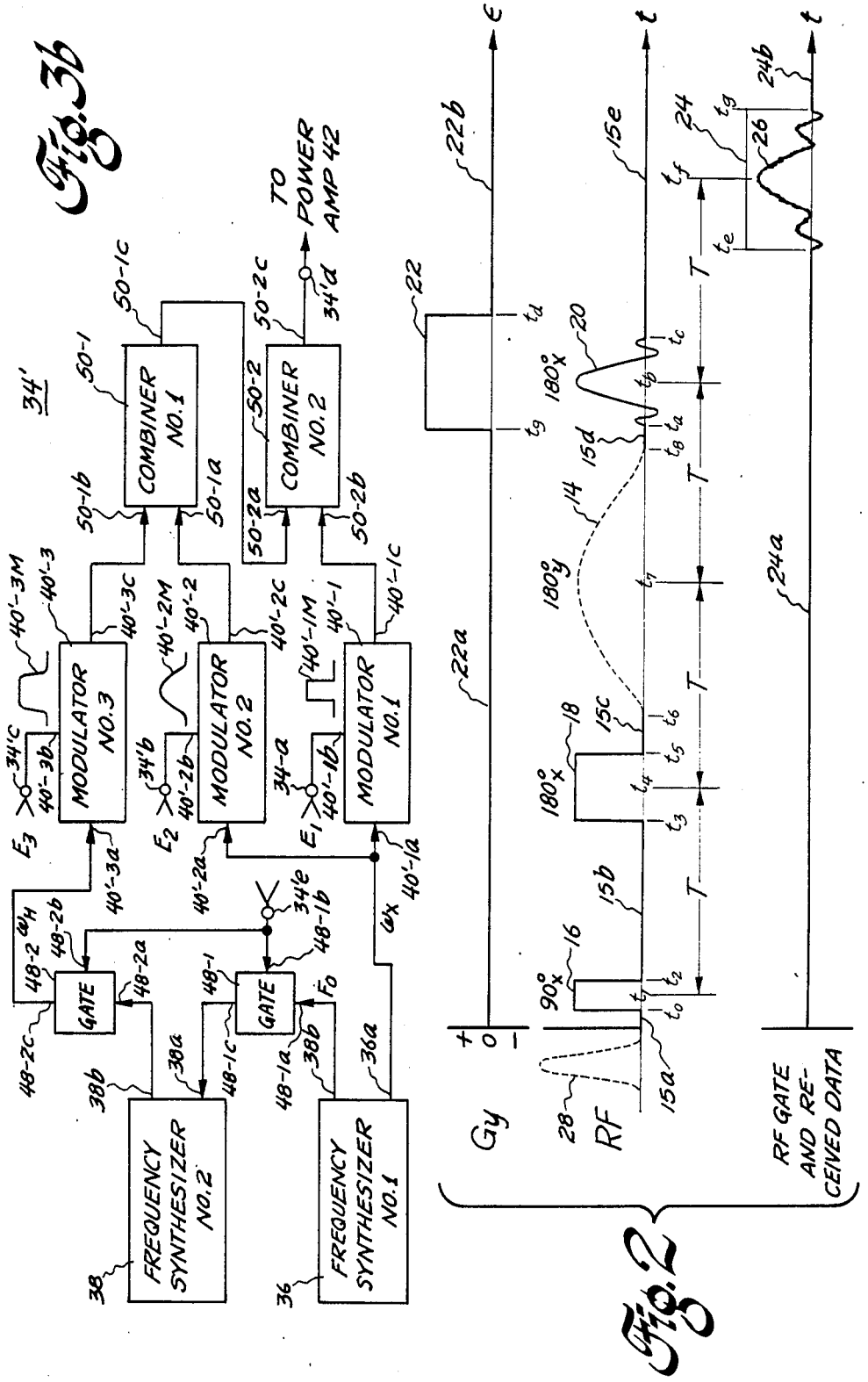

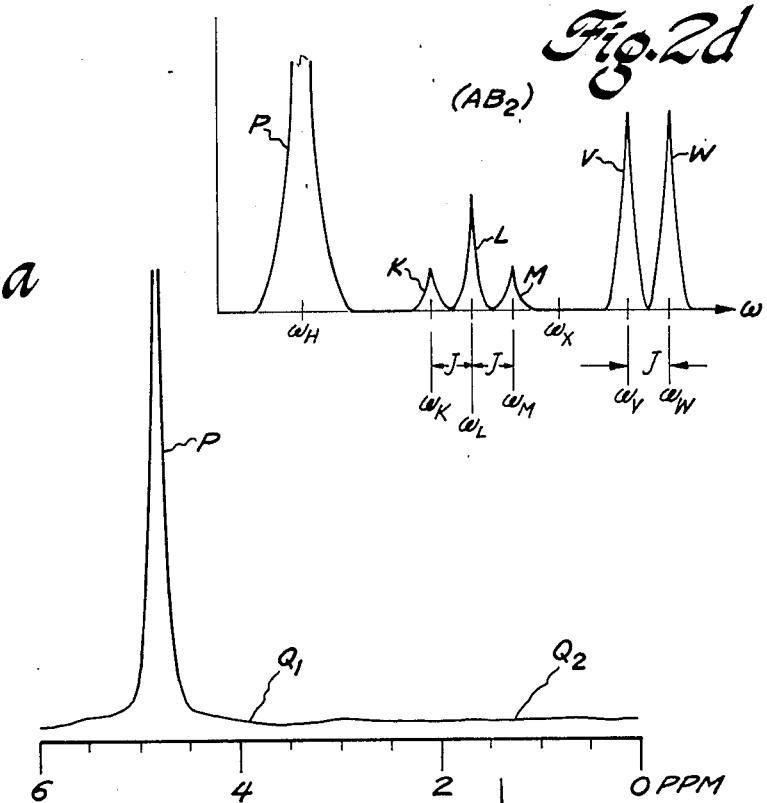
Fig.2d
Fig.4a
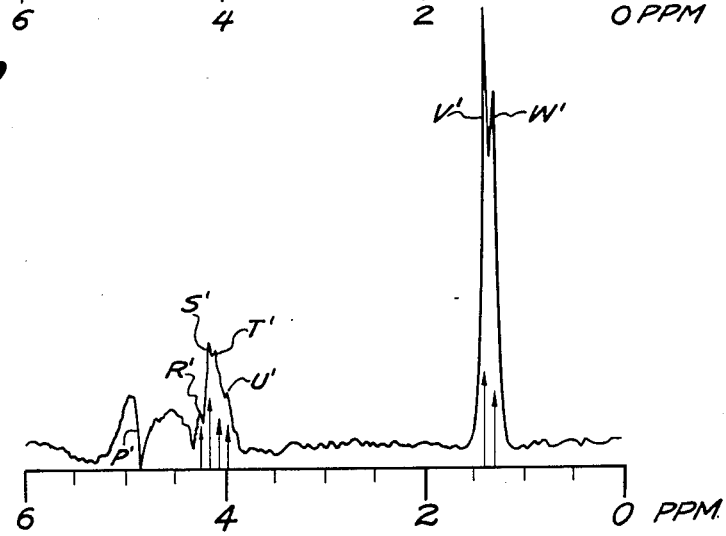
Fig.4b

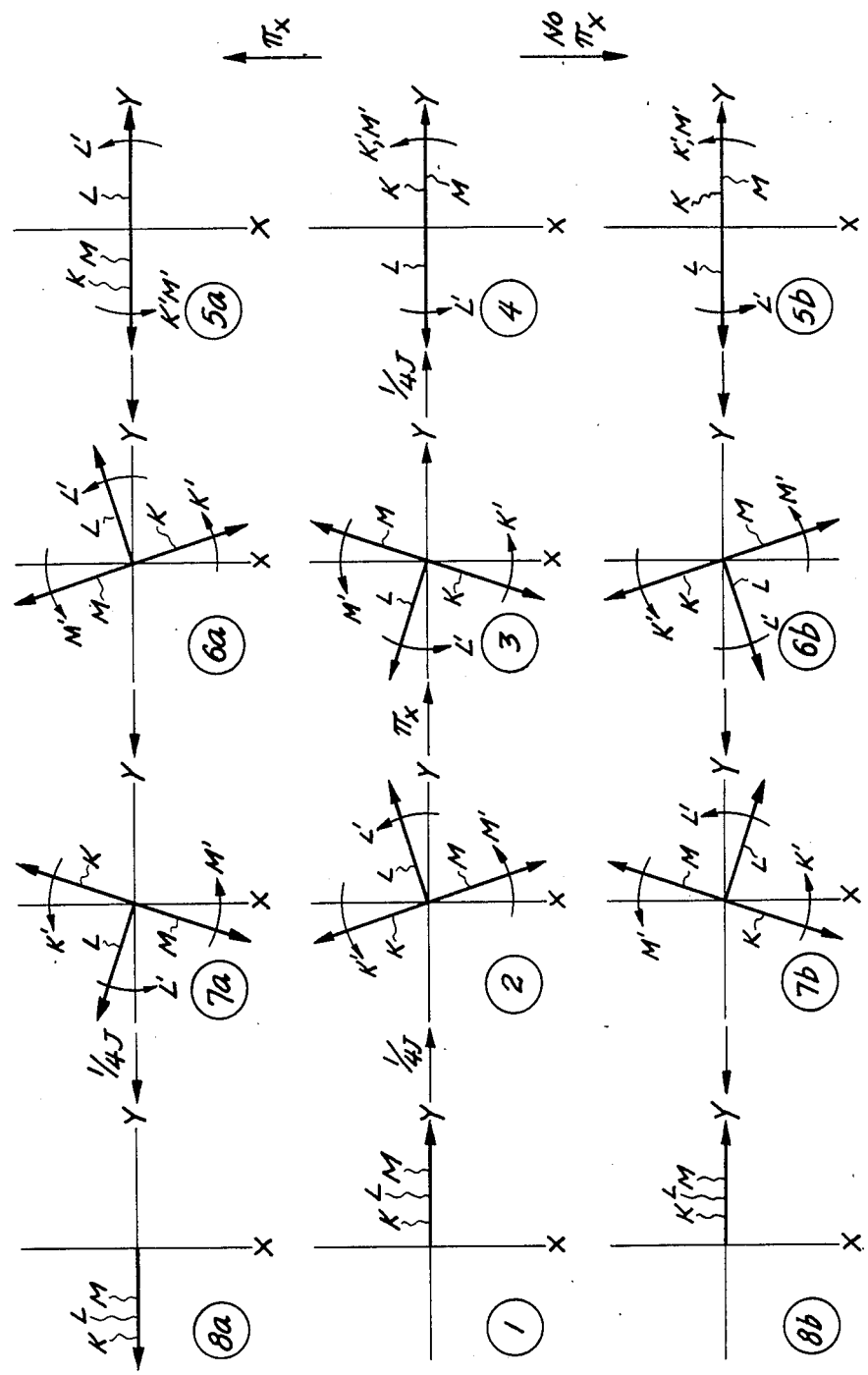

POLARIZATION TRANSFER BY SELECTIVE HOMONUCLEAR TECHNIQUE FOR SUPPRESSION OF UNCOUPLED SPINS IN NMR SPECTROSCOPY

BACKGROUND OF THE INVENTION

The present invention relates to nuclear magnetic resonance (NMR) spectroscopy and, more particularly, to a novel method for polarization transfer by a selective homonuclear technique (POTSHOT) for suppressing response signals from at least one selected resonance of uncoupled spins while retaining response signals from at least one other selected resonance of coupled spins. In typical use, all uncoupled spin respohse signals are suppressed, as are all coupled spin response signals except those from a preselected spin system.

It is now well known that nuclear magnetic resonance (NMR) in-vivo phosphorous ($^{31}P$) spectroscopy is a useful tool for monitoring human metabolism. However, in-vivo phosphorous spectroscopy suffers from the relatively long time interval (typically at least ten minutes) required for acquisition of a spectrum with reasonable signal-to-noise ratio. The length-of-time problem might be avoided if hydrogen ($^1H$) spectroscopy could be utilized, instead of phosphorous spectroscopy, because the NMR sensitivity of hydrogen is roughly fifteen times as great as the phosphorous sensitivity; hydrogen spectroscopy has a data-collection time which may be two, or more, orders of magnitude less than the data-collection time for phosphorous, if the same signal-to-noise ratio is to be achieved. However, it is well known that $^1H$ spectroscopy suffers from the presence of uncoupled-spin resonances from certain components, such as water and the like, and from the presence of coupled-spin resonances, such as lipids and the like, of the sample to be investigated, which are typically four orders of magnitude and three orders of magnitude, respectively, larger than the spectral peaks of interest (e.g. lactate components and the like). Further, these undesired uncoupled-spin resonances are positioned approximately at the same spectral position as the desired metabolite peaks, rendering the detection of the desired metabolite peaks virtually impossible by conventional techniques. Accordingly, it is highly advantageous to provide a method for acquiring spin resonance responses from coupled hydrogen spins in metabolites in in-vivo human samples, in the presence of in-vivo human tissue components, including water, lipid and the like substances, having uncoupled hydrogen spin resonances.

PRIOR ART

Several methods have been proposed which utilize a narrow bandwidth RF signal pulse, centered at the frequency of the offending spectral peak, for suppressing that unwanted resonance peak in the total acquired NMR response spectrum. Perhaps the most straight forward approach is the application of a temporally long presaturating pulse utilized to suppress the offending signal peak response (usually that of a water resonance) prior to receiving and processing the desired spectrum. Another technique, popularly known as "1-3-3-1", utilizes a series of $\pi/2$, or 90°, RF signal pulses and interleaved delays, to maneuver the undesired component (e.g. water) hydrogen spin vectors into a longitudinal direction, while the spins of the desired resonances are maneuvered into the transverse plane. These techniques are both troubled by the necessity for also suppressing all metabolite resonances having chemical shifts which are close to those of the undesired (e.g. water) resonances, while leaving other undesired (e.g. lipid) resonances more or less unaffected.

Still other techniques are known which discriminate against the water resonance peak by utilization of differences in the spin-lattice relaxation time $T_1$ and the spin-spin relaxation time $T_2$ between the undesired (water) species and other chemical species. Thus, long echo times can be quite effectively utilized to suppress the water peak in some tissues, while leaving other resonances, such as that of $\beta$ lactate, substantially unaffected; however, many of the lipid resonances are unfortunately also unaffected. Similarly, other methods utilize an inverting pulse, having a delay equal to the null time constant ($T_{null}$) of the undesired species (water), prior to read out; while suppressing the later resonance, these methods not only also partially suppress the desired metabolite resonance peaks, but also do not in general discriminate against other undesired (lipid) resonances and the like.

Several existing methods suppress response signals from uncoupled spin resonances by utilization of scalar coupling between adjacent atoms of the same molecule. The coupled spins, nutated into the transverse plane, are acted upon by a sequence of RF signal pulses and delays which cause the coupled spin magnetization to evolve in a manner different from the manner in which uncoupled spin magnetizations evolve. Some techniques, such as Homonuclear Polarization Transfer using a broadband 90°, or $\pi/2$, RF signal pulse to invert the phase of all coupled spins having a coupling constant near the hydrogen coupling constant J, cannot discriminate against final spectrum lipid resonances which are coupled to one another. This disadvantage may be overcome with another method, known as Homonuclear Double-Resonance Difference Spectroscopy, which allows retention of certain coupled peaks, e.g. the lactate resonance, while excluding certain other resonances, e.g. the lipid alkyl resonances, by superimposing a narrowband 180° RF signal pulse, centered on one of the lactate peak frequencies, and superimposed upon a broadband 180° RF signal pulse. The narrowband pulse only inverts the phase of the remaining lactate resonance peak, to which the first resonance peak is coupled, but only if the frequency of the narrowband pulse is correctly set within about 1 Hz.; incorrect frequency establishment will cause the original lactate peak to be distorted in phase and/or amplitude, and may result in the desired signals cancelling one another in the final spectrum.

BRIEF SUMMARY OF THE INVENTION

In accordance with the invention, our novel method for suppressing at least one undesired resonance response signal while facilitating reception of at least one other desired NMR response signal from a coupled spin resonance in NMR spectroscopy, utilizes the steps of providing a pair of alternating sequences of RF signal pulses, each sequence having (a) an initial 90°, or $\pi/2$, RF signal pulse for nutating the coupled and uncoupled spin resonances about a first axis of a Cartesian coordinate system, imposed upon the sample to be investigated; (b) a 180°, or $\pi$, RF signal pulse, also rotating the spins about the first axis, and having a temporal midpoint occurring at a time interval T after the temporal midpoint of the initial pulse, where T is substantially equal to n/4J, where n is an odd integer 1, 3, 5, ... and J is the spin coupling constant of the hydrogen ($^1H$) nuclei; and (c) a final amplitude-modulated 180°, or $\pi$, RF signal pulse with a substantially symmetrical envelope of a Gaussian, sinc or other predetermined substantially symmetrical shape, and with a temporal midpoint at twice the time interval T after the temporal midpoint of the first 180° RF signal pulse in that sequence; and providing only one of the pair of sequences with a polarization transfer narrowband 180°, or $\pi$, RF signal pulse, symmetrically disposed about a temporal midpoint which is located at substantially a time interval T after the first 180° RF signal pulse of that sequence, and substantially at a frequency removed from the resonance frequency of the at least one undesired uncoupled spin resonance. The received response signals are acquired within a response gating period having a temporal midpoint substantially equal to the time interval T after the temporal midpoint of the final 180° RF signal pulse. The final RF signal pulse rotates the spin vectors about the first direction axis. The recovered set of data from one of the sequential pair is subtracted from the other to obtain a processed data set in which noncoupled spin resonance data is substantially cancelled and desired coupled spin resonance data is present. Rotation of spin vectors about a second axis, substantially orthogonal to the first coordinate set axis, is utilized for coupled spins of molecular components having a form $A_aB_b$, where both a and b each are an odd number, and the sum of the subscripts (a+b) is an even number; for molecular components having an odd subscript sum and a odd while b is even, rotation about the first axis is utilized. Both the first and second axes are generally orthogonal to the direction of the system static magnetic $B_o$. Alternation of phase of the narrowband RF signal pulse, by 180°, in alternating sequential ones of a pair of sequence pairs, can be utilized for increased noncoupled spin resonance suppression.

Accordingly, it is an object of the present invention to provide novel methods for selective homonuclear polarization transfer to suppress at least one undesired resonance response signal while facilitating the reception of at least one desired response signal in NMR spectroscopy.

This and other objects of the invention will become apparent to those skilled in the art upon reading the following detailed description, when considered in conjunction with the drawings.

BRIEF DESCRIPTION OF THE DRAWINGS

FIG. 2 is a set of time-related graphs illustrating the radio frequency and magnetic gradient field excitation applied to a sample, in accordance with the principles of the present invention, to reinforce NMR spectroscopy response signals from desired hydrogen nuclei with coupled spins while suppressing NMR spectroscopy response signals from undesired hydrogen nuclei with noncoupled spins, and of the gated received data signal responsive thereto;

FIG. 2d is an amplitude-frequency diagram graphically illustrating the various response signals evoked from uncoupled and coupled resources of an aqueous solution of a molecule of the AB$_2$ form;

FIG. 2e is a set of spin vector diagrams illustrating the effects of our method upon the coupled triplet of spins of the AB$_2$ molecule;

FIG. 3b is a schematic block diagram of a presently preferred RF exciter for providing the required stimuli for carrying out our novel method in a NMR spectroscopy system;

FIGS. 4a and 4b are frequency-deviation-related spectra from a first phantom respectively without and with the use of the POTSHOT method of the present invention.

DETAILED DESCRIPTION OF THE INVENTION

Figure 1A:
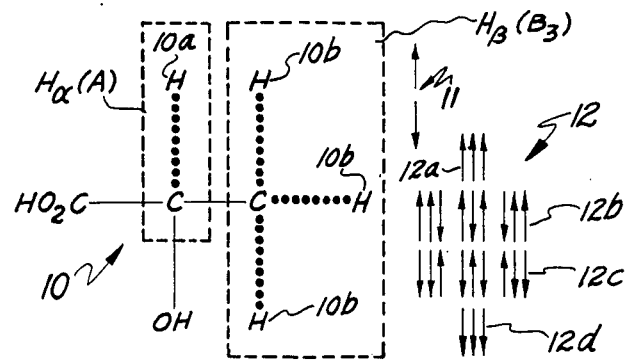
FIG. 1a is a schematic drawing of a lactate molecule from which a desired NMR response signal is to be evoked.

Referring initially to FIG. 1a, a molecule 10, present in a sample from which NMR spectroscopic information is to be obtained, is one having homonuclear scalar coupling between nuclei therein. For purposes of illustration, molecule 10 is a type AB$_3$ molecule, e.g. a lactate molecule, in which scalar coupling exists between a single hydrogen atom 10a (having a single bond, shown s a line of circles, with the middle carbon atom, in the H$_\alpha$(A) moiety) and the three hydrogen atoms 10b (each having a bond, shown by the line of circles, to an end carbon atom, in the H$_\beta$(B$_3$) moiety). Responsive to both an externally-impressed static magnetic field B$_O$ is a basic direction (e.g. along the Z axis of a 3D coordinate system) and an external RF magnetic field B$_1$, in a plane substantially orthogonal to the direction of the B$_0$ field, an RF resonance response signal can be received and analyzed. Since the H$_\alpha$(A) hydrogen atom 10a can have the spin of its nucleus pointing either up or down, the nuclear spins of the H$_\beta$(B$_3$) atoms 10b encounter one of two different local environments, so that the peak of their resonance is split into a doublet 11 of spectral lines, each of a substantially similar amplitude. Similarly, the three $\beta$ hydrogen atoms 10b can assume spin configurations 12 with any one of: all three spins pointing in the upward direction, in the single configuration 12a; one spin in the downward direction and the other two spins in the upward direction, in the three possible configurations 12b; two spins in the downward direction and one spin in the upward direction, in the three possible configurations 12c; or all three spins in the downward direction, in single configuration 12d. Therefore, the $\alpha$ hydrogen atom 10a sees four different environments (the environments of spin configurations 12a–12d) and its resonance is split into a quartet of spectral lines, having relative intensities 1:3:3:1.

Figure 1B:
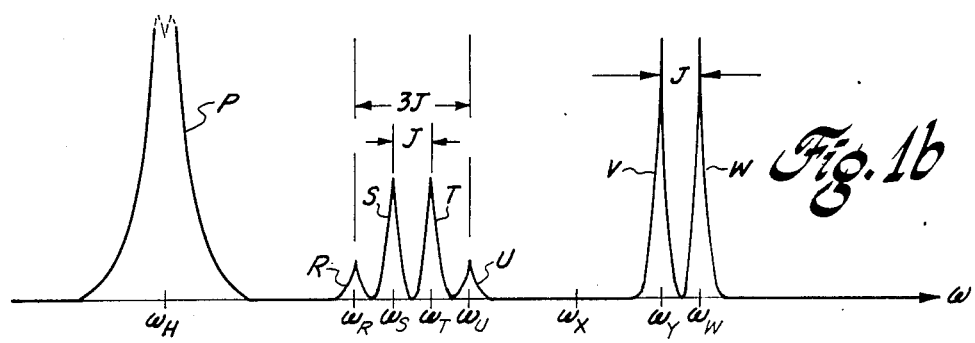
FIG. 1b is an amplitude-frequency diagram graphically illustrating the various response signals evoked from the uncoupled and coupled resonances of an aqueous solution of a molecule (lactate) of the AB$_3$ form.

Referring to Figure 1b, the relative resonance intensities, not to scale, of an illustrative sample are shown with respect to frequency $\omega$. At least one uncoupled spin, from a solvent and the like (such as water and the like) in the sample, may provide a high intensity resonance spectral component P at an uncoupled hydrogen nucleus frequency $\omega_H$. The $\alpha$ hydrogen coupled spin $H_\alpha(A)$ of the illustrated $AB_3$ molecule provides the quartet of spectral components R, S, T and U at respective frequencies $\omega_R$, $\omega_S$, $\omega_T$ and $\omega_U$, with each of the peaks separated by the spin-spin coupling constant J (approximately 7.35 Hz. for $^1H$). The $\beta$ hydrogen resonances $H_\beta(B_3)$ provide the doublet resonance peaks V and W, at respective frequencies $\omega_V$ and $\omega_W$, with the coupling constant J frequency separation therebetween. It will be seen that the relatively huge amplitude of the uncoupled spin resonance component P dwarfs the much smaller amplitudes of the desired coupled spin spectral components R-W, so that any attempt to acquire the coupled spin spectral components, in the presence of the uncoupled spin spectral component P, is exceedingly difficult, if not impossible. Some means must be provided for at least partially, if not completely, suppressing spectral component P, if a usable spectrum of components R, S, T, U, V and/or W is to be obtained. While not shown, for simplicity, a practical sample need not have a single undesired spectral line P; an in-vivo human sample can have a plurality of undesired line components (water, lipid, etc.) which must all be suppressed if desired coupled spin responses are to be recovered.

Referring now to FIG. 2, in accordance with the invention, final response data, in which uncoupled spin spectral components are suppressed while at least one coupled spin resonance spectral component is retained, is provided by subtracting a pair of data sets each evoked by subjecting the sample to one of a sequential pair of excitation sequences, in which the sequence pair contains one sequence containing of a coupled-spin-system phase peak inverting pulse 14 while the other sequence of the pair is devoid of that pulse 14.

In each pair, both sequences commence at a time $t_0$, prior to which time the radio-frequency (RF) excitation magnetic field $B_1$ is at a substantially zero amplitude, as at portion 15a. A 90°, or $\pi/2$, RF signal pulse 16 commences at time $t_0$ and terminates at time $t_2$, and provides the $B_1$ field along a first axis of a 3-dimensional coordinate system in which the sample is located, e.g. along the X-axis of a Cartesian coordinate system located within the static magnetic field of the NMR system. Typically, the system $B_0$ static magnetic field is located on the Z-axis. Pulse signal 16 nutates the nuclear spins about the first (X) axis and into the transverse plane, i.e. the XY plane of the Cartesian coordinate system. Thereafter, the RF magnetic field $B_1$ is of substantially zero amplitude, as in portion 15b, until the start, at time $t_3$, of a 180°, or $\pi$, rephasing RF signal pulse 18 with its magnetic field $B_1$ along the first (X) axis. Pulse signal 18 terminates at time $t_5$. The time delay T, between the time $t_1$ substantially at the middle of the nutation pulse 16 and the time $t_4$ substantially at the middle of the rephasing pulse, is substantially equal to (n/4J), where n=1, 3, 5, .... After another substantially zero amplitude RF magnetic field portion 15c, the coupled-spin reversal signal pulse 14 is provided, but only in the first of each pair of sequential excitation sequences. Pulse 14 is a 180°, or $\pi$, RF signal pulse (preferably with a Gaussian envelope shape) substantially symmetrical about time $t_7$, which itself occurs the time interval T after the rephasing pulse 18 temporal midpoint $t_4$. Another substantially zero amplitude RF field portion 15d appears after the cessation, at time $t_8$ of the coupled spin selective pulse 14 and prior to the commencement time $t_a$ of a spatially-selective $\pi$, or 180°, RF magnetic field signal pulse 20. Pulse 20 provides an RF magnetic field $B_1$ about the first (X) axis and temporally substantially symmetrical about a mid-time $t_b$, itself situated at the end of another T time interval from the mid-time $t_7$ of the coupled spin selection pulse 14, if present in that sequence, or after the time interval 2T from the mid-time $t_4$ of the 180° pulse 18 in that sequence, of the sequence pair devoid of the narrowband coupled-spin selection pulse 14. The spatially-selective RF pulse 20, terminating at time $t_c$, is a generally symmetric signal having a modulated envelope for best spatial localization of the response. The modulation may be of any desired type, such as the truncated sin(x)/x pulse 20 (illustrated), and the like. Typically, spatially selective pulse 20 will be temporally coincident with a substantially-constant portion of a gradient magnetic field pulse 22. Pulse 22 commences at a time $t_9$ after the termination time $t_8$ of the coupled-spin-retention pulse 14 and prior to the $\pi$ pulse signal 20 commencement time $t_a$. Pulse 22 terminates at a time $t_d$ after the spatially selective RF pulse signal 20 termination time $t_c$. The use of a single non-zero gradient pulse signal 22 is only one presently preferred embodiment, utilizing the spatial localization techniques of DRESS spectroscopy, as described and claimed in allowed U.S. patent application Ser. No. 626,941, filed on July 2, 1984 and incorporates herein in its entirety by reference. It should be understood that other spatial location techniques, utilizing at least one magnetic field gradient, can be utilized with the POT-SHOT methods of the present invention.

Each excitation sequence, of the excitation sequence pair, evokes a response signal from the sample. Each response signal is received by the NMR system RF spectrometer responsive to a RF reception gate pulse signal 24, which enables reception between time $t_e$ and time $t_g$ so disposed that a gate time $t_f$, during the interval, is also at the time interval T after the mid-time $t_b$ of the spatially-selective pulse 20. It should be understood that the gate commencement time $t_e$ can be as early as time $t_c$, while the gate termination time $t_g$ can be any desirable time (e.g. after the received signal has decayed for a fixed interval, etc.). The otherwise-substantially-zero amplitude gate signal portions 24a and 24b thus prevent any of the response signal 26 from being provided outside of the time interval during which gating pulse 24 is present. It should be understood that, while not absolutely necessary, it is highly desirable to precede each of the excitation sequences with at least one solvent suppression, and the like, RF signal pulse 28, which saturates, or otherwise suppresses, the lipid, water or the like uncoupled spin resonance component(s) P.

Coupled spin resonance selection pulse 14 is a $\pi_Y$ RF signal pulse, i.e. about a second, or Y, axis substantially orthogonal to the first (X) axis (and also generally orthogonal to the $B_o$ field), only in a coupled spin system of even total subscript i.e. a selected $A_aB_b$ spin system, where the sum (a+b) of the subscripts is even and subscript a is an odd number. Thus, in an AB spin system, with (2) subscript total or an $AB_3$ spin system, also with (4) total and the like, the $\pi_y$ pulse 14 is used. For a system with an odd a subscript and an odd subscript total, such as an $AB_2$ spin system, the sequence is modified such that RF pulse 14 is a 180°$_x$, or $\pi_x$, pulse (about the first (X) axis) which allows retention of all peaks in a system with a phase twist of $\pi$ between the two multiplets. In either case, the RF frequency is essentially that of the spectral component to be recovered; pulse 14 has a "soft" profile, as its frequency components are to be distributed over a narrower bandwidth, and is thus more frequency selective than the wide-frequency "hard" (or square-cornered pulses) 16 and 18.

The response data 26 from each sequence is received, digitized and stored. The stored data from the second sequence of each sequence pair is then subtracted from the first sequence stored data (or vice versa), so that some of the spectral component peaks are constructively added while others are cancelled. Specifically, the response data from uncoupled spin components cancel while the coupled spin peaks, selected by that one of pulse 14 in use, occurs with inverted phase in the data of one of the responses, with respect to the data in the other response, such that subtraction of one from the other set of data actually causes addition of the two coupled spin response components in the final data set.

Figure 2A:
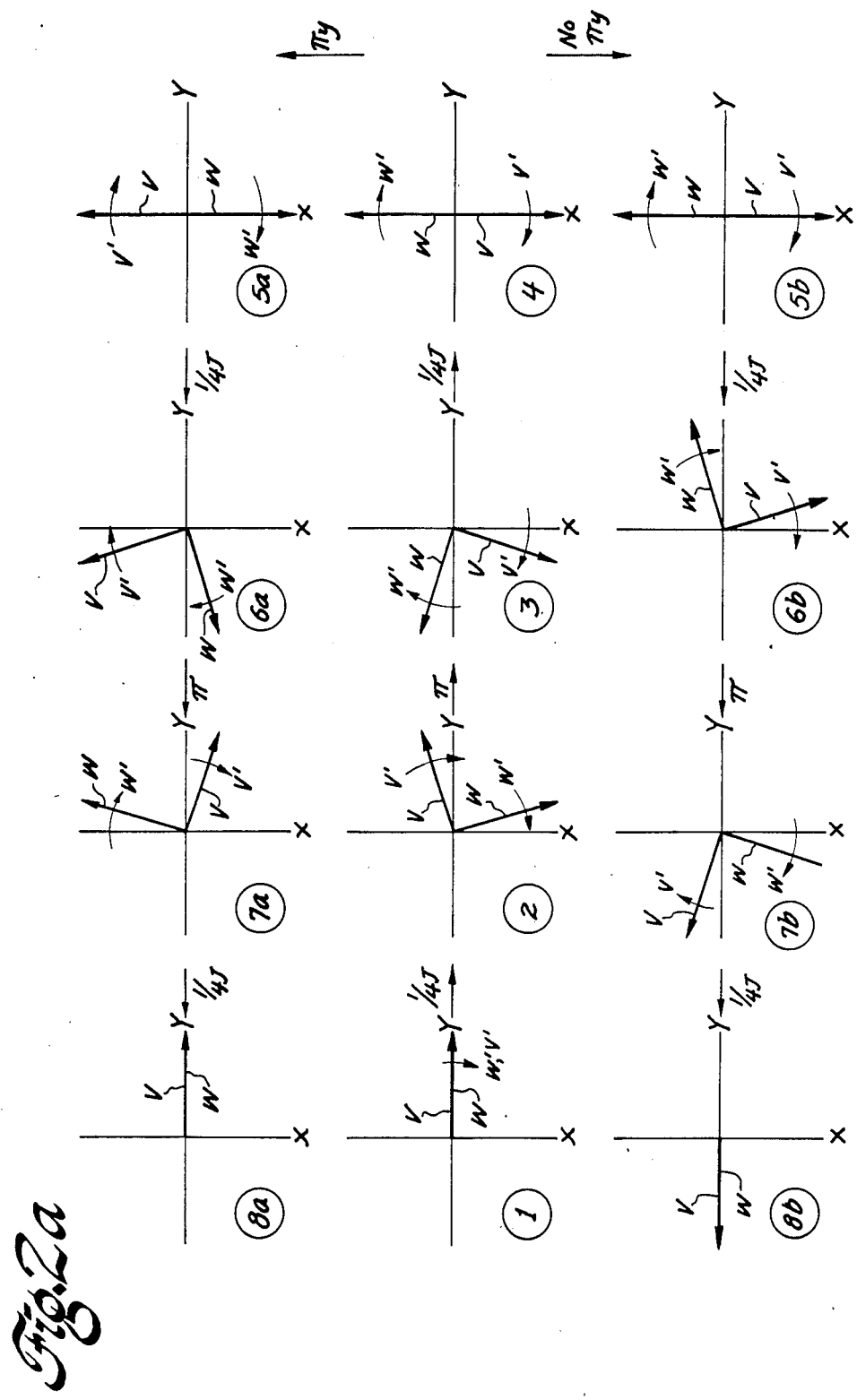
FIGS. 2a, 2b and 2c are sets of spin-vector diagrams illustrating the effects of our method upon the respective lactate coupled doublet of spins, uncoupled water spin singlet, and coupled lactate quadruplet of spins.

Referring to FIG. 2a, this selective reinforcement of coupled spin components is seen with respect to the $\beta$ lactate doublet components V and W (in an illustrative $AB_3$ spin system). The initial pulse nutates both of the spin vectors V and W into the XY plane, as seen in view (1); the spins, with respect to a reference system rotating at the excitation signal $\omega_X$ frequency, are rotating in the direction of respective arrows V' and W' (which, since the excitation frequency $\omega_X$ is illustratively outside the doublet, are in the same direction). The first 1/4J delay is long enough for the pair of spins to move 90° out of phase with one another, as seen in view (2). The first broadband $\pi_x$ pulse 18, as seen in view (3), causes not only the inversion of the B doublet about the X axis, but also inverts the A spins, which has the effect of switching the "labels" on the B doublet. The second 1/4J delay leaves the spins, as shown in view (4), pointing along the X axis in antiparallel directions, e.g. with the V spin in the positive direction. As will be seen in FIG. 2c, the A quartet of spin vectors, which have also been inverted and "relabelled", also lie in antiparallel directions along the X axis, with R and T spins opposed to the S and U spins for the RSTU quartet. Since no selective pulses have been yet applied, all of the even-subscripted multiplets present, and not just those of the selected spin system, will be in a similar anti-parallel condition. Uncoupled spins, as will be seen with respect to FIG. 2b, will, on the other hand, be left pointed along the Y axis at this time, since they have been inverted but are uninvolved in polarization transfer.

If the excitation sequence includes a $\pi_y$ pulse 14, one follows the upwardly-directed $\pi_y$ arrow to view (5a), illustrating that the narrowband 180° pulse, applied to the A quartet, directly inverts that quartet about the Y axis, while inverting the B doublet through spin relabelling. Other coupled-spin resonances are generally unaffected by this pulse, since this pulse is chemically-shift-selective. Uncoupled-spin resonances are also unaffected, both because of the chemical-shift selectivity and because the uncoupled spins, as will be seen in sequence 2b, are pointed along the Y axis when the pulse is applied. If the second one sequence of the sequence pair is occurring, i.e. without pulse 14, one proceeds downwardly, in the direction of the "No $\pi_y$" arrow, to view 5b, wherein the V and W components are aligned in the exact same direction, along the X axis, and with the exact same rotation vectors V' and W', as in view (4). It should be noted that if the data were acquired and subtracted at this time, only the selected $AB_3$ spin system resonances would add constructively. However, the different multiplet components would alternate between positive and negative phase, providing an especially undesirable situation for multiplets which are not well resolved. Therefore, the final pair of delays, equivalent to a n/2J delay, is utilized, with the broadband 180°$_x$ pulse 20, in the center of this delay time interval, providing time reversal to negate the effect of chemical shift. The spins of both the A quartet and the B doublet therefore have opposite phase at the end of the two halves, as shown in views (8a) and (8b), so that the peaks effectively add upon subtraction of the data from the two different signals.

Figure 2B:
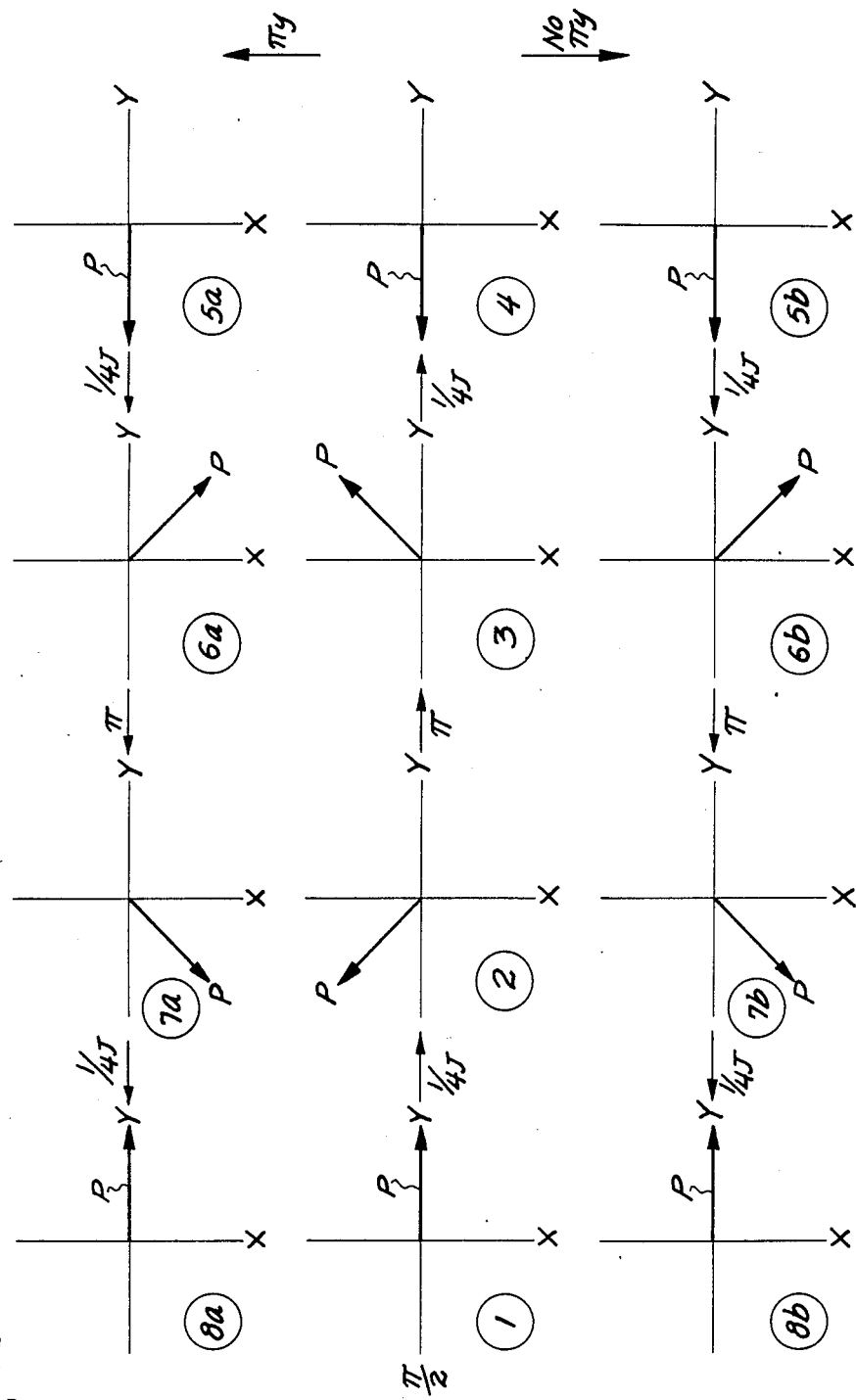

Those uncoupled-spin components P to be suppressed (from water or other solvent) to be suppressed are operated upon as shown in FIG. 2b. In view (1), the spin vector P has been nutated into the XY plane by the $(\pi/2)_x$ signal pulse 16. After the initial time delay, seen in view (2), the time reversal pulse 18 rotates spin P about the X axis (view (3)); the second delay interval causes spin P to lie in the negative Y direction as shown in view (4). As there is no effect upon an uncoupled spin due to the chemical-shift-selective signal pulse 14, the P spin vector continues to lie in the −Y direction whether or not the $\pi_y$ pulse is present, as shown in respective views (5a) and (5b). Thereafter, the same action occurs, such that, after the third T delay interval, spin vector P lies in the same direction in the XY plane, as seen in views (6a) and (6b) After the spatially selective pulse 20, the spin vectors P are merely rotated about the X axis, as seen in views (7a) and (7b). Finally, after the fourth and final T delay interval, the P vectors lie in the same +Y direction, as seen in views (8a) and (8b). Therefore, when the +Y signal data for the first excitation sequence is subtracted from the +Y signal data recovered responsive to the second excitation sequence, a substantially zero amplitude results. That is, the uncoupled spin vectors have the same orientation in both excitation sequences of the sequence pair and subtract away in the final difference spectrum. The identical operations occur even if the excitation sequence is modified such that the chemically selective pulse 14 is applied to the B doublet or the A quartet.

Figure 2C:
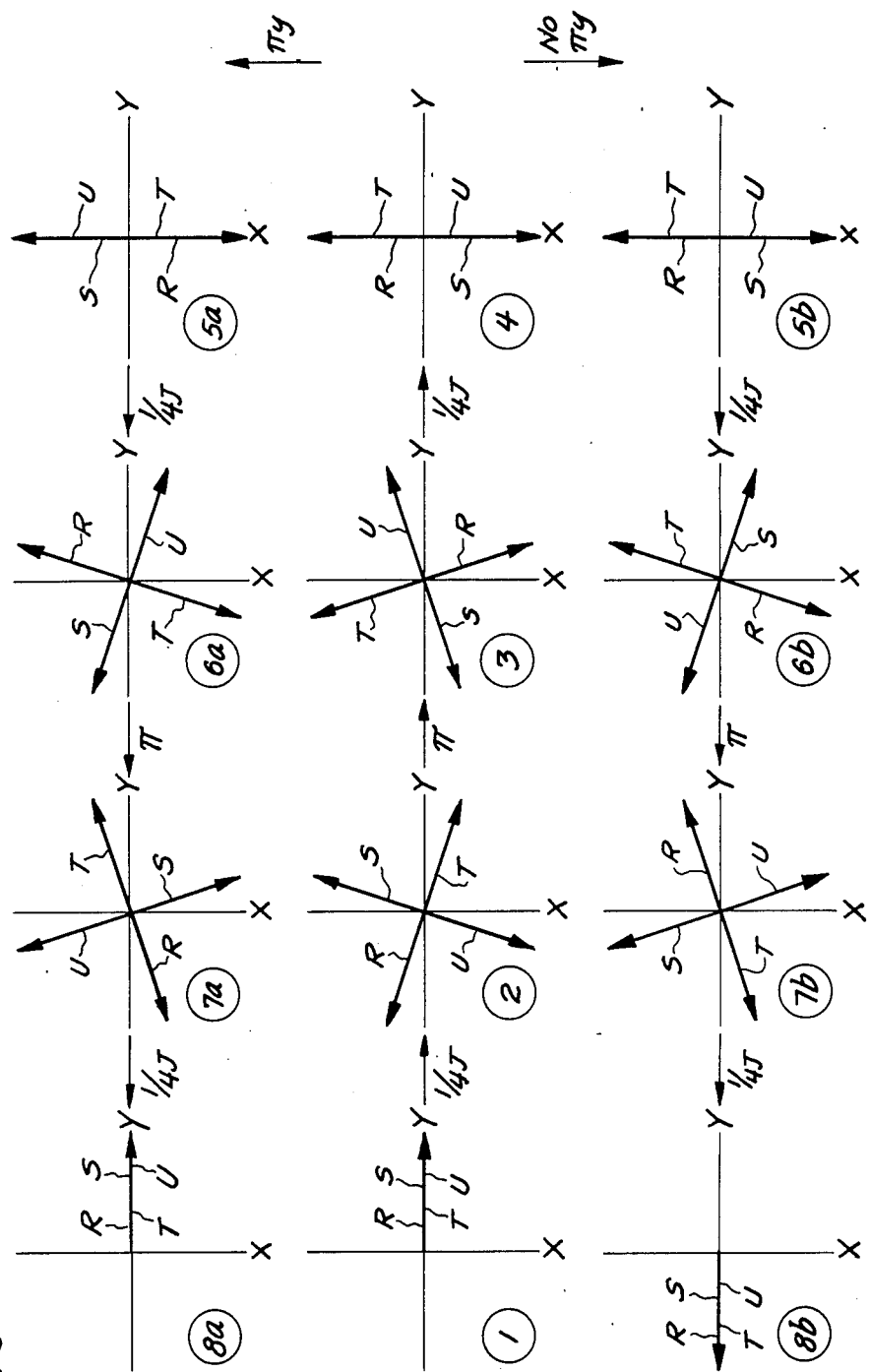

Referring now to FIG. 2c, the quadruplet RSTU is, as previously mentioned, initially nutated to the +Y axis of the XY plane, as seen in view (1), by the 90°$_x$ signal pulse 16. After the initial delay, the antiparallel spins R and T are substantially orthogonal to the antiparallel spins S and U, as seen in view (2). The $\pi_x$ signal pulse 18, as previously mentioned, not only rotates the quartet of vectors about the X axis, but also relabels each antiparallel pair, as shown in view (3). After the second delay interval, as shown in view (4), the now-parallel spins R and T are antiparallel to the +X-axis-directed parallel S and U spin vectors. If the chemical shift-selective $\pi_y$ pulse is applied, the vectors are rotated about the Y axis, such that the R and T spins are now in the +X direction, as shown in view (5a); there is no rotation, as seen in view (5b) if pulse 14 is not present in the excitation sequence. After the third T delay, the spin vectors of views (6a) and (6b) obtain. The spatially-selective signal pulse 20 rotates the components about the X axis and causes relabelling to obtain view (7a) in the "pulse 14 present" sequence and view (7b) in the "no pulse 14 present" sequence. After the fourth and final delay, the quadruplet spins R-U all lie in the +Y direction, shown in view (8a), if selective pulse 14 was present in the sequence, while the quadruplet spins R-U all lie in the −Y direction, as shown in view 8b, if signal pulse 14 was not present. After the data for these two sets are taken and subtracted, it will again be seen that constructive addition will occur.

Referring now to FIGS. 2d and 2e, an AB$_2$-type molecule may have the illustrated spectrum. At least one solvent peak P, at a frequency $\omega_H$, is present with an amplitude far exceeding the amplitudes of either the V and W doublet components due to the A band splitting, or the K-L-M triplet components due to the B$_2$ band splitting. The effects of the sequential $(\pi/2)_x$ signal pulse (view 1), the first delay (view 2), the $\pi_x$ RF signal pulse (view 3) and the second delay (view 4) leaves the triplet with spins aligned along the Y-axis, with the first and third spins in one Y direction and the second spin of the triplet in the other Y direction. The $\pi_x$ RF signal pulse, if present, serves to flip the triplet spins (view 5a) with respect to the sequence devoid of this pulse (view 5b). The effects of the third delays (views 6a and 6b), the selective $\pi_x$ pulse (views 7a and 7b) and the final fourth delay (views 8a and 8b) illustrate that the final signals, acquired in the successive pair of sequences, are out-of-phase with one another, so that subtraction of one recovered data set from the other data set provides a final data set in which the triplet responses add and the uncoupled spin resonance effects substantially cancel.

In practice, instrument imperfections and missed RF signal pulses can often lead to less than optimum suppression of the unwanted resonance components (such as the P component of FIG. 1b, and the like). Accordingly, incorporation of simple phase cycling into our novel excitation sequence, as by alternation between the +Y and −Y phases for the selective $\pi$, pulse 14 in even-subscript systems, or alteration between the +X and −X phases for the selective $\pi_x$ pulse 14 in odd-subscript systems, may be utilized to reduce small errors, although this tends to lengthen the basic cycle length from two acquisitions to four acquisitions. Of course, those skilled in the art will understand that even more complicated phase cycling schemes may be utilized, with the concomitant use of longer total cycling times.

It should also be understood that other solvent suppression techniques may be used. We presently prefer use of the low level presaturating pulse 28, at the front of each sequence of the pair, utilizing a RF magnetic field B$_1$ amplitude of about 2mG for about two seconds. Other known chemical shift selective, T$_1$ or T$_2$ techniques can be equally as well used. The use of a preliminary solvent suppression technique is highly advantageous, as the RF spectrometer receiver will encounter a reduced dynamic range of total response signal. In spite of the relatively long (e.g. two second) length of the presaturating pulse 28, much less RF power is deposited in the sample than might be expected; in any event, we have found that the average power of the presaturating pulse is of comparable magnitude to average power of the "hard" ("square") pulses 16 and/or 18 of the sequences. It will also be understood that, since lactate peaks have much longer coupling T$_2$ times, with respect to the T$_2$ times for the water peak in many tissues, long echo times can also be utilized to discriminate against the water signal. We presently prefer long echo times as provided by utilizing n=3 (for a total T=3/4J delay of about 408 milliseconds) rather than the T=1/4J delay (of about 136 milliseconds) otherwise utilized.

Figure 3A:
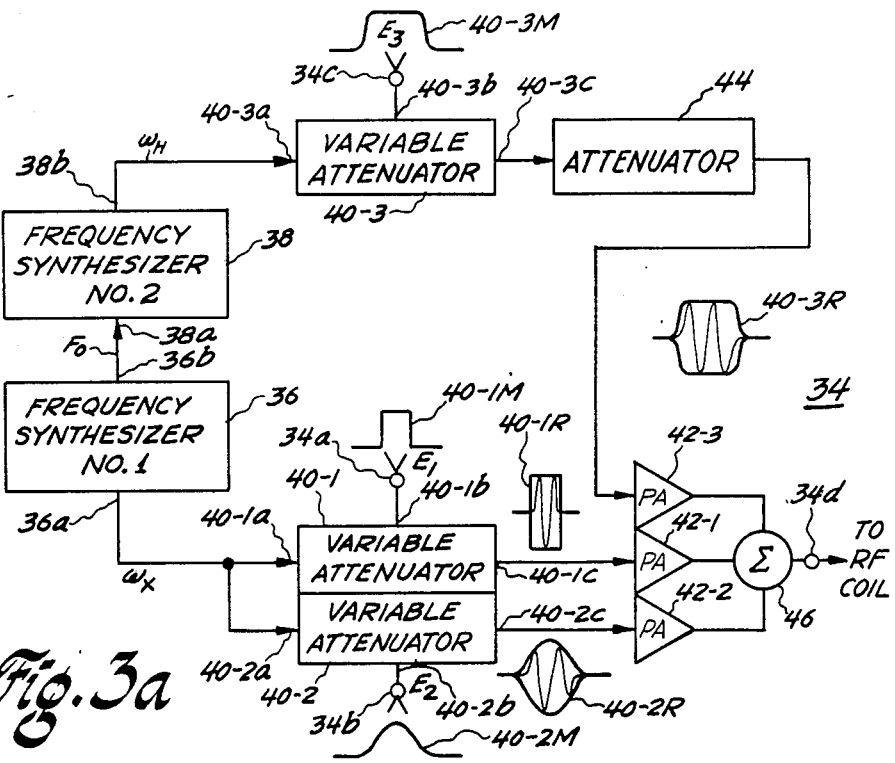
FIG. 3a is a schematic block diagram of one transmitter for providing the RF stimulus signal required for our novel method.

Referring now to FIG. 3a, one embodiment of apparatus for providing the actual excitation signal for the complete excitation sequence (including the optional low-power, relatively long-duration presaturation pulse 28) is illustrated. Apparatus 34 includes a first frequency synthesizer means 36, operating at a first frequency $\omega_x$ in the near vicinity of the desired coupled resonance components, e.g. near one of frequencies $\omega_R-\omega_W$, at its first output 36a. The master oscillator signal of the first synthesizer is provided at a second output 36b, to a master oscillator input 38a of a second frequency synthesizer 38. This frequency F$_o$ synchronizes the signal at second synthesizer mean output 38b, which is set to the frequency $\omega_H$ of the undesired spectral component P which is to be suppressed. This component may be close to, but is always different from, the frequency $\omega_x$ of the first synthesizer. A variable attenuator, or modulator, means 40 is provided for each of the three different types ("hard", "soft" and "long pulse presaturation") of signal pulses to be used. Thus, a first electronically variable attenuator 40-1 receives the first synthesizer output signal at its input 40-1a and receives at its control input 40-1b a control signal E$_1$ "hard" pulse waveform 40-1M, from the first apparatus input terminal 34a. Responsive to the RF signal and the modulation waveform 40-1M, a first-frequency $\omega_x$ square-waveshape modulated RF pulse signal 40-1R appears at the variable attenuator output 40-1c, and is amplified by a first power amplifier PA means 42-1, to provide the RF signal pulses 16 and 18. Similarly, a second variable attenuator means 40-2 receives the first frequency synthesizer output signal at its RF input 40-2a and receives at its control "input 40-2b a "soft" modulation E$_2$ signal waveform 40-2M, from a second apparatus input 34b. A "soft" modulated RF signal 40-2R is provided at the second variable attenuator output 40-2c, for amplification in a second power amplifier PA means 42-2, to provide the "soft"-enveloped excitation signal pulses 14 and/or 20, also at the first frequency $\omega_X$. It will be understood that, while first variable attenuator means 40-1 need only have an essentially binary response (being either "on" for transmission of the frequency synthesizer signal through to the associated power amplifier, or "off" to prevent transmission of that signal), the second variable attenuator has a generally linear relationship between the magnitude of the modulated RF signal at its output, with respect to the instantaneous amplitude of the control signal at its control input. A second generally-linear variable attenuator means 40-3 receives at its RF input 40-3a the signal at undesired spectral component frequency $\omega_H$ and receives a suppression modulation singal E$_3$, of waveform 40-3M, at its control input 40-3b, from a third apparatus input 34c. The modulated RF signal 40-3R at output 40-3c may be further attenuated by an additional attenuation means 44, to provide the driving signal for another power amplifier PA means 42-3, utilized to establish the suppression pulse 28. The output of all of power amplifier means 42 may be combined in a combiner means 46, to provide total excitation power to an apparatus output 34d, for connection to the RF coil utilized in the NMR spectrometer to excite the sample.

Referring now to FIG. 3b, the presently preferred apparatus 34' is utilized to provide a single excitation signal to a single power amplifier means 42 (as use of only a single multi-kilowatt power amplifier means is desirable for cost reduction purposes). In this presently preferred embodiment, the first synthesizer master oscillator frequency F$_0$ signal is provided to the input 48-1a of a first gating means 48-1, receiving a binary on/off signal at a control input 48-1b from an apparatus gating input 34'e. The gated master oscillator signal at gate output 48-1c is provided to second synthesizer master oscillator input 38a. Similarly, the undesired spectral component frequency $\omega_H$ signal at second synthesizer output 38b is provided to the input 48-2a of a second gating means 48-2. Responsive to the gating signal, introduced at second gating means control input 48-2b, the synchronized RF signal at second gating means output 48-2c is only present when the apparatus input 34'e signal is in the "on" condition. The modulated RF signals at the respective soft modulator number 2 and number 3 outputs 40'-2c and 40'-3c, respectively are coupled to the respective first and second inputs 50-1a and 50-1b, respectively, of a first combiner means 50-1. The combined soft pulse signal set, at combiner output 50-1c, is provided to a first input 50-2a of a second combiner means 50-2, which receives the hard pulse signal, from first modulator output 40'-1c, at its second input 50-2b. The combined RF excitation signal is provided at second combiner output 50-2c, to apparatus output 34'd, for introduction to the input of an external power amplifier means 42.

Illustratively, spectra to be described hereinbelow were acquired on a 1.5 Tesla (T) whole-body research system utilizing a body coil for RF transmission, and an electronically-decoupled surface coil, with about a 6 centimeter diameter, for reception. The decoupling circuit of the surface coil prevents that reception coil from distorting the transmitted RF excitation field; the decoupling mechanism was not utilized with the transmit coil, as any such mechanism has a nonlinear portion which somewhat distorts the "soft" R signal pulses 14, 20 and/or 28. The absence of a decoupling mechanism is not a problem during reception, since the surface coil reception antenna is relatively much smaller than the body coil excitation antenna and there is relatively little coupling therebetween.

Referring now to FIGS. 4a and 4b, one experimental result is illustrated of the utilization of our novel POTSHOT excitation sequences. The spectrum of FIG. 4a is a hydrogen $^1H$ spectrum obtained from a 3 centimeter diameter, 10 milliliter sphere containing a 100 millimolar (mM) lactate solution in a 1.5 percent agarose solute; the response signal was read out from the phantom as a free-induction decay (FID) signal immediately after excitation. It will be seen that the unwanted water resonance peak P totally obscures the lactate resonances located in the now seemingly "quiet" zones $Q_1$ and $Q_2$ of the spectrum.

FIG. 4b illustrates the spectral response obtained from the same sample utilizing the POTSHOT excitation sequence pair of the present invention with the presaturation pulse 28 (of approximately 2 second duration and magnetic field strength $B_1$ of about 2mG.) for water peak suppression. The amplitude of suppressed water peak P' is reduced by a factor of approximately 500 (with respect to the amplitude of the water peak P of the spectrum of FIG. 4a). Utilizing the agarose to lower the relaxation time $T_2$ of the water to a physiological range of about 100 milliseconds, and utilizing a total of 8 averages, including subtracting of phase cycling, with a 2.2 second repetition time, the $\alpha$ lactate quartet R'-U' and the $\beta$ lactate doublet V' and W' are clearly visible at offsets of 4.1 ppm and 1.3 ppm, respectively. In this spectrum, the $\alpha$ peak has, as expected, the same phase and roughly one-third the area of the $\beta$ peak, When the selective pulse is moved in frequency to about an equal frequency offset to the other side of the $\beta$ peak (e.g. to about $-1.5$ ppm), suppression of the water peak is somewhat more complete (e.g. to a suppression factor of about 1500 times) but, as there is no transfer of polarization by the selective pulse, the lactate peaks are subtracted away from one another and do not appear in the difference spectrum.

Figure 5A:
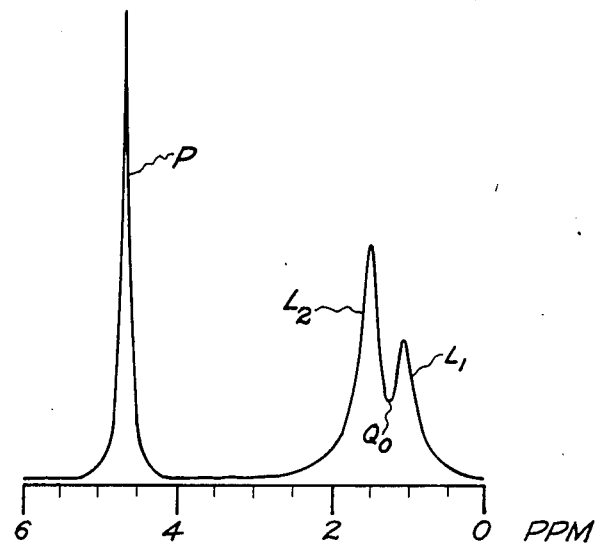
FIGS. 5a and 5b are frequency-deviation-related spectra from a second phantom respectively without and with the use of the POTSHOT method of the present invention.
Figure 5B:
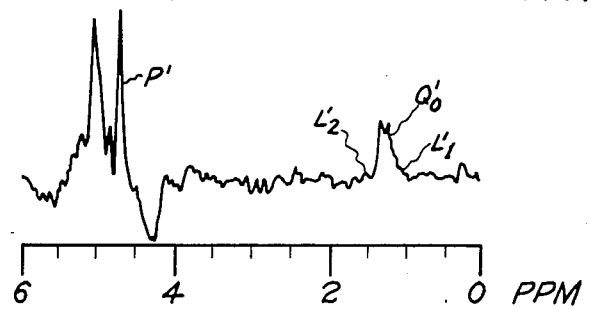

Because lactate is present in-vivo in concentrations on the order of 10 mM. or less and is often obscured by large lipid ($CH_2$ and $CH_3$) peaks arising from fat, oil and the like, we utilize a 10mM lactate phanthom in agarose, with a vial of machine oil located nearby, to obtain the spectra of FIGS. 5a and 5b. The FID spectrum of FIG. 5a was obtained with n=1. The water peak P, at about 4.7 ppm, and lipid peaks $L_1$ and $L_2$, at about 1.1 ppm and 1.5 ppm, respectively, completely obscure the desired lactate spectra in region $Q_O$. However, when the POTSHOT method is utilized in conjunction with presaturation of the water peak and long echo times, it will be seen that the oil resonances $L_1'$ and $L_2'$ are no longer visible, having been suppressed by a factor of about 10,000 in the spectrum, and the water peak P' has been suppressed by a factor of about 1500, such that the $\beta$ lactate peak $Q_o'$ is clearly seen at about 1.3 ppm. This spectrum, obtained in 16 seconds, utilizes four averages. The water peak presaturation pulse has caused modulation of the spectrum baseline, leading, along with noise, to the obscuration of the $\alpha$ lactate peak.

In both POTSHOT spectra FIGS. 4b and 5b, the selective excitation pulse 14 is a Gaussian pulse of between 30 and 40 milliseconds FWHM, although more selective pulses, such as a hypobolic secant pulse and the like, may provide even better suppression in a particular experiment.

While several presently preferred embodiments of our novel polarization transfer by selective homonuclear techniques have been described herein for suppression for undesired uncoupled spins in NMR spectroscopy, many variations and modifications will now become apparent to those skilled in the art. It is our intent, therefore, to be limited only by the scope of the appending claims, and not by the specific embodiments presented by way of example herein.

What we claim is:

1. An NMR spectroscopy method for obtaining from a sample a processed spectrum including at least one desired coupled-spin resonance response signal from that sample and in which is substantially suppressed at least one undesired one of uncoupled-spin and coupled-spin resonance response signal, comprising the steps of:
   (1) immersing the sample in a static magnetic field $B_O$;
   (2) providing at least one pair of alternating sequences of pulses of a radio-frequency (RF) magnetic field $B_1$ signal in the sample, each sequence having
      (a) a substantially 90° initial RF signal pulse for nutating the desired coupled-spin resonances and the at least one undesired resonance about a first axis of a Cartesian coordinate system imposed upon the sample,
      (b) a substantially 180° RF signal pulse for rotating the spin resonances about the first axis, and having a temporal midpoint occurring substantially after a time interval T after the temporal midpoint of the initial pulse, where T=n/4J, n is a positive odd integer and J is the spin coupling constant of the desired nucleus type, and
      (c) a substantially 180° final RF signal pulse for rotating the spin resonances about the first axis, and having a temporal midpoint occurring after a time interval 2T after the temporal midpoint of the first 180° RF signal pulse of that sequence;

(3) providing only one of each sequence pair with a polarization transfer 180° RF signal narrowband pulse, having a temporal midpoint occurring after a time interval T after the temporal midpoint of the first 180° RF signal pulse of that sequence, and having a frequency different from the frequency of each of the at least one undesired uncoupled-spin resonance;

(4) acquiring for each sequence a set of response data during a response gating period including a temporal point thereof occurring after a time interval T after the final RF signal pulse of that sequence;

(5) subtracting one of the sequentially acquired pair of response data sets from the other to provide a difference data set; and (6) displaying the difference data set as the processed spectrum of the sample.

2. The method of claim 1, wherein the final RF signal pulse spatially localizes that portion of the sample from which a subsequent response signal is received, and further comprising the steps of; providing a magnetic field gradient in the static field; amplitude-modulating the final RF pulse signal of each sequence to have a substantially symmetric envelope of predetermined characteristic; and simultaneously setting the gradient field amplitude to localize the response signal to a predetermined portion of the sample.

3. The method of claim 1, wherein the at least one desired resonance is from a molecule of type $A_aB_b$, where a is an odd integer and b is an odd integer, and further comprising the step of rotating, with the polarization transfer pulse, the spin resonances about a second axis, substantially perpendicular to the first axis.

4. The method of claim 3, further comprising the step of providing the polarization transfer pulse with a Gaussian envelope.

5. The method of claim 1, wherein the at least one desired resonance is from a molecule of type $A_aB_b$, where a is an odd integer and b is an even integer, and further comprising the step of rotating the spin resonances about the first axis with the polarization transfer pulse.

6. The method of claim 5, further comprising the step of providing the polarization transfer pulse with a Gaussian envelope.

7. The method of claim 1, further comprising the step of preceding the initial pulse of each sequence with an excitation signal for presaturating at least one of the undesired spin resonances.

8. The method of claim 7, wherein the presaturating signal is an RF signal pulse having a limited bandwidth substantially centered at the resonance frequency of the associated undesired spin resonance.

9. The method of claim 7, wherein the presaturating signal is essentially at the frequency of an undesired water resonance.

10. The method of claim 7, wherein the presaturating signal is essentially at the frequency of an undesired lipid resonance.

11. The method of claim 1, further comprising the steps of; repeating steps (2)-(5) with the polarization transfer pulse having, during each different pair of sequences, a preselected different one of a sequence of phases; and averaging the difference sets to obtain a final difference data set from which the processed spectrum is displayed.

12. The method of claim 1, wherein n=1.

13. The method of claim 1, wherein n=3.

14. The method of claim 1, wherein the spectrum is obtained from hydrogen ($^1H$) nuclei.

15. The method of claim 14, wherein spectral contributions from hydrogen ($^1H$) nuclei in water are substantially suppressed.

16. The method of claim 15, wherein at least one spectral line of water is reduced in amplitude by at least two orders of magnitude with respect to the amplitude thereof responsive to excitation by step (2) without step (3).

17. The method of claim 14, wherein spectral contributions from hydrogen ($^1H$) nuclei in lipids are substantially suppressed.

18. The method of claim 17, wherein at least one spectral line of lipid is reduced in amplitude by least two orders of magnitude, with respect to the amplitude thereof responsive to excitation by step (2) without step (3).

* * * * *